United States Patent
Ott et al.

(10) Patent No.: US 10,651,858 B2
(45) Date of Patent: May 12, 2020

(54) SYNTHESIZER AND PHASE FREQUENCY DETECTOR

(71) Applicant: Sony Corporation, Tokyo (JP)

(72) Inventors: Arndt Thomas Ott, Stuttgart (DE); Mathias Krempig, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/194,408

(22) Filed: Nov. 19, 2018

(65) Prior Publication Data
US 2019/0165794 A1    May 30, 2019

(30) Foreign Application Priority Data
Nov. 30, 2017  (EP) .................... 17204714

(51) Int. Cl.
| | | |
|---|---|---|
| H03L 7/06 | (2006.01) | |
| H03L 7/087 | (2006.01) | |
| H03L 7/22 | (2006.01) | |
| H03L 7/113 | (2006.01) | |
| H03C 3/09 | (2006.01) | |
| H03L 7/091 | (2006.01) | |
| H03L 7/23 | (2006.01) | |
| H03L 7/089 | (2006.01) | |

(52) U.S. Cl.
CPC ........... *H03L 7/087* (2013.01); *H03C 3/0941* (2013.01); *H03C 3/0958* (2013.01); *H03C 3/0966* (2013.01); *H03L 7/089* (2013.01); *H03L 7/091* (2013.01); *H03L 7/113* (2013.01); *H03L 7/22* (2013.01); *H03L 7/23* (2013.01)

(58) Field of Classification Search
CPC . H03L 7/087; H03L 7/22; H03L 7/113; H03L 7/091; H03L 7/23; H03L 7/089; H03C 3/0966; H03C 3/0941; H03C 3/0958

USPC ......................................... 327/105, 147–159
See application file for complete search history.

(56) References Cited

U.S. PATENT DOCUMENTS

| | | | | |
|---|---|---|---|---|
| 7,940,142 B2 * | 5/2011 | Jensen | ................ | H03C 3/0925 332/120 |
| 8,531,219 B1 * | 9/2013 | Dunworth | ................ | H03L 7/08 327/147 |

(Continued)

FOREIGN PATENT DOCUMENTS

EP        2 782 255 A1    9/2014

OTHER PUBLICATIONS

Gao, X., et al., "A Low Noise Sub-Sampling PLL in Which Divider Noise is Eliminated and PD/CP Noise is Not Multiplied by N2," IEEE Journal of Solid-State Circuits, vol. 44, No. 12, pp. 3253-3263 (Dec. 2009).

(Continued)

*Primary Examiner* — Ryan Jager
(74) *Attorney, Agent, or Firm* — Xsensus LLP

(57) ABSTRACT

A synthesizer comprises a two-point modulation phase locked tow, TPM PLL, circuit configured to receive a frequency tuning signal and to generate a stepped chirp signal in an intermediate frequency range by applying a two-point modulation PLL on the frequency tuning signal, and a subsampling PLL circuit configured to receive the stepped chirp signal in a mm-wave frequency range and to generate a smoothened chirp signal in a mm-wave frequency range by applying a subsampling PLL on the stepped chirp signal.

13 Claims, 13 Drawing Sheets

(56) References Cited

U.S. PATENT DOCUMENTS

| | | | |
|---|---|---|---|
| 8,654,006 B2 | 2/2014 | Landez et al. | |
| 8,731,502 B2 | 5/2014 | Salle et al. | |
| 8,786,315 B2 | 7/2014 | Nesreen et al. | |
| 8,884,672 B2 | 11/2014 | Ballantyne et al. | |
| 9,197,224 B2* | 11/2015 | Kinget | H04L 27/18 |
| 10,291,214 B2* | 5/2019 | Thijssen | G06F 1/10 |
| 2004/0210790 A1* | 10/2004 | Moon | H03L 7/091 |
| | | | 713/500 |
| 2007/0297551 A1* | 12/2007 | Choi | H04L 7/033 |
| | | | 375/371 |
| 2017/0324416 A1* | 11/2017 | Jakobsson | H03L 7/091 |

OTHER PUBLICATIONS

Li, Y-A, et al., "A fully integrated 77GHz FMCW radar system in 65nm CMOS," 2010 IEEE International Solid-State Circuits Conference, ISSCC 2010, © 2010 IEEE, pp. 216-217, (Feb. 9, 2010).

Markulic, N., et al., "9.7 A Self-Calibrated 10Mb/s Phase Modulator with -37.4dB EVM Based on a 10.1-to-12.4GHz, -246.6dB-FOM, Fractional-N Subsampling PLL," 2016 IEEE International Solid-State Circuits Conference, Session 9, High-Performance Wireless, ISSCC 2016, © 2016 IEEE, pp. 176-177 (Feb. 2, 2016).

Raczkowski, K., et al., "A 9.2-12.7 GHz Wideband Fractional-N Subsampling PLL in 28nm CMOS With 280 fs RMS Jitter," IEEE Journal of Solid-State Circuits, vol. 50, Issue 5, pp. 1203-1213 (May 2015).

Wu, W., "Millimeter-Wave Digitally-Assisted Frequency Synthesizer in CMOS," Dissertation, TU Delft, pp. 1-196 (Sep. 24, 2013).

Xu, N., et al., "Chapter 17: Hybrid Phase Modulators with Enhanced Linearity," Wireless Transceiver Circuits: System Perspectives and Design Aspects, pp. 445-490 (Feb. 6, 2015).

Yeo, H., et al., "13.1 a 940MHz-bandwidth 28.8μs-period 8.9GHz chirp frequency synthesizer PLL in 65nm CMOS for X-band FMCW radar applications," IEEE International Solid-State Circuits Conference (ISSCC), Session 13, Wireless Systems, pp. 238-239 (Jan. 31-Feb. 4, 2016).

\* cited by examiner

SYNTHESIZER AND PHASE FREQUENCY DETECTOR

CROSS-REFERENCE TO RELATED APPLICATION

This application claims priority to the European Patent Application No. 17204714.4 on 30 Nov. 2017, the entire contents of which being incorporated herein by reference.

BACKGROUND

Field of the Disclosure

The present disclosure relates to a synthesizer and a phase frequency detector.

Description of Related Art

Fast chirp modulation schemes are required for future radars. Current Frequency-Modulated Continuous-Wave (FMCW) synthesizers employ fractional-n PLL synthesizers. However, these synthesizers are limited with respect to chirp speed. Two point modulated synthesizers overcome these problems as the PLL remains locked during the entire chirp sequence. However, two-point modulated phase locked loops can only approximate a linear frequency modulation with discrete frequency steps. This impairment leads to unwanted ghost targets in the radar image.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a synthesizer that avoids the generation of unwanted ghost targets and provide low phase noise and low frequency error.

It is a further object to provide a phase frequency detector that can be advantageously used in such a synthesizer and that optimizes the tuning of the phase locked loop in a synthesizer.

According to an aspect there is provided a synthesizer comprising
- a two-point modulation phase locked loop, TPM PLL, circuit configured to receive a frequency tuning signal and to generate a stepped chirp signal in an intermediate frequency range by applying a two-point modulation PLL on the frequency tuning signal, and
- a subsampling PLL circuit configured to receive the stepped chirp signal and to generate a smoothened chirp signal in a mm-wave frequency range by applying a subsampling PLL on the stepped chirp signal.

According to a further aspect there is provided a phase frequency detector (PFD) comprising circuitry configured to generate phase detection signal, wherein the circuitry is configured to generate a predetermined time interval in which the dead zone phase frequency detector does not generate a phase detection signal.

Embodiments are defined in the dependent claims.

One of the aspects of the disclosure is to use a novel synthesizer concept with two cascaded PLLs, which can e.g. be manufactured in CMOS technology as integrated circuitry. The synthesizer comprises a two point modulated PLL, generating the intermediate frequency. This signal drives a second PLL, which preferably includes a fast subsampling phase detector (SSPD) and dead zone PFD. From the input stepwise increasing frequency signal, the second PLL generates a straightened, almost linearly increasing frequency signal in the mm-wave region. Further, high phase accuracy may be achieved by use of the SSPD. The provided synthesizer enables FMCW signal (i.e. chirp signal) generation for radar applications.

The dead zone PFD may be advantageously used in a synthesizer according to the present disclosure or in other synthesizers comprising a PLL, e.g. having a subsampling phase detector (with limited phase detection range). It provides for adjustment of the frequency. After frequency adjustment the PLL, e.g. the subsampling PLL in a synthesizer according to the present disclosure, supports further phase tuning of the PLL.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
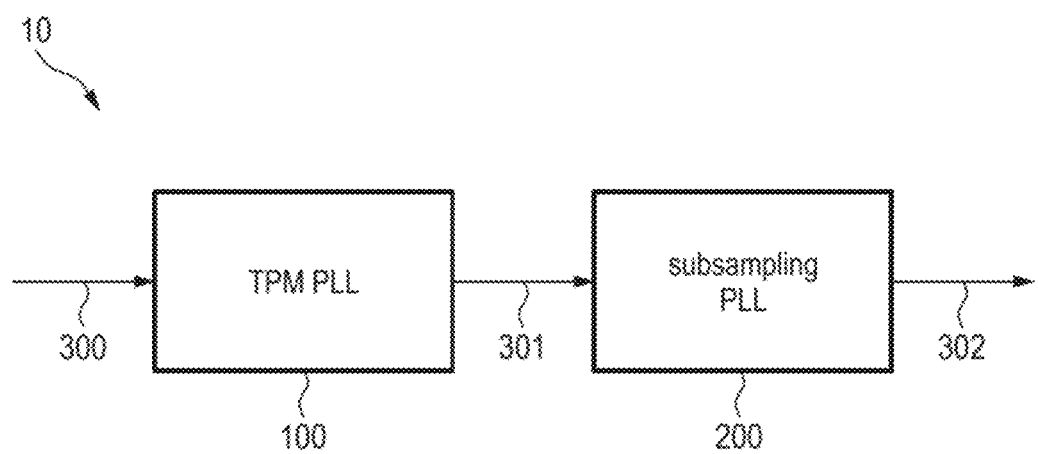
FIG. 1 shows a schematic diagram of a first embodiment of a synthesizer according to the present disclosure.

Referring now to the drawings, wherein like reference numerals designate identical or corresponding parts throughout the several views, FIG. 1 shows a first embodiment of a synthesizer 10 according to the present disclosure. The synthesizer 10 comprises a two-point modulation (TPM) phase locked loop (PLL) circuit 100 and a subsampling PLL circuit 200. The TPM PLL circuit 100 is configured to receive a frequency tuning signal 300 and to generate a stepped chirp signal 301 in an intermediate frequency range by applying a two-point modulation PLL on the frequency tuning signal 300. The subsampling PLL circuit 200 is configured to receive the stepped chirp signal 301 and to generate a smoothened chirp signal 302 in a mm-wave frequency range by applying a subsampling PLL on the stepped chirp signal 301.

In fractional-n PLL synthesizers the phase is unlocked when fast chirps are synthesized by the PLL. Hence, fractional-n PLL architectures cannot fulfill the future requirements of the automotive industry in terms of modulation bandwidth, chirp linearity, and chirp speed. To achieve phase lock for applications, where signal modulation bandwidth is much larger than PLL loop bandwidth, TPM PLL synthesizers have been used. TPM PLLs generally comprise a high frequency feedback path for fast modulation and a low frequency path for phase and frequency locking. Hence, loop and modulation bandwidth are decoupled from each other. Frequency switching is hereby often achieved by sigma delta modulation of the frequency divider in the feedback loop. It has been found, however, that this limits the upper frequency range of the feedback loop due to the required oversampling factor and introduces more phase noise and spurs to the system. Further, it has been found that PLL based frequency synthesizers suffer either from limited chirp speed or root mean square (RMS) frequency error and that TPM PLLs suffer from a coarse discrete frequency ramp approximation.

The synthesizer according to the present disclosure, comprising two cascaded PLLs, overcomes these deficiencies. The two-point modulation applied on the first PLL allows a flexible choice of loop bandwidth, optimizing for best phase noise performance. A chirp with discrete frequency steps is synthesized on an intermediate frequency. The first PLL is followed by a second subsampling PLL. Extremely low phase noise and low frequency error is achieved due to the subsampling approach. Furthermore, the discrete frequency steps are smoothened, leading to an almost linear frequency chirp, small phase fluctuations and a large chirp evaluation time.

Figure 2:
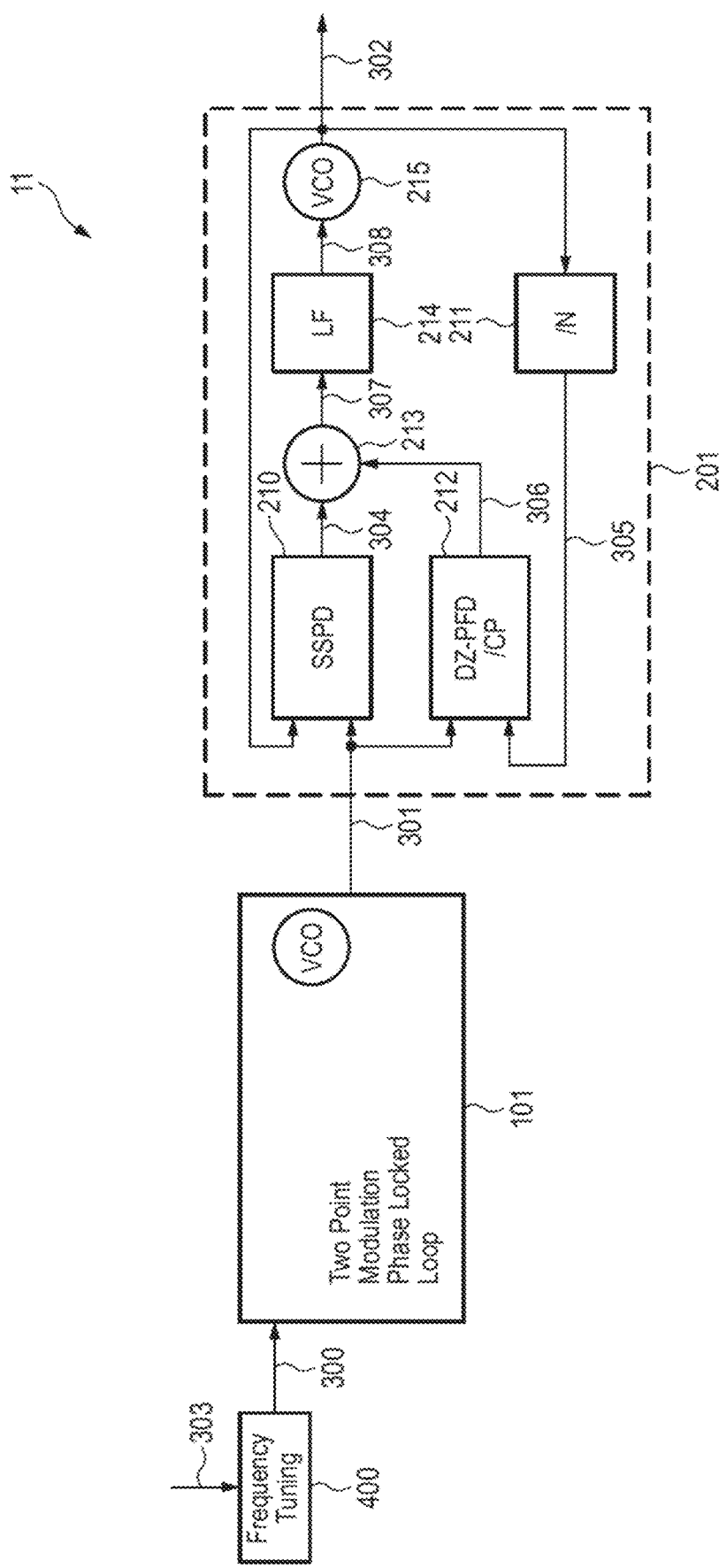
FIG. 2 shows a schematic diagram of a second embodiment of a synthesizer according to the present disclosure.

FIG. 2 shows a schematic diagram of a second embodiment of a synthesizer 11 according to the present disclosure. A fast-stepped frequency FMCW chirp signal 301 is generated by the TPM PLL circuit 101. The TPM PLL circuit 101 can be implemented as an analogue, partly digital or all digital PLL. The output signal 301 of the TPM PLL is applied as reference signal to the subsampling PLL circuit 201. The subsampling PLL circuit 201 converts the intermediate frequency chirp signal 301 (e.g. in the range of 100 MHz to 10 GHz) to the mm-wave domain (e.g. in the range of 30-300 GHz). The input signal 301 of the second PLL circuit 201 is a chirp signal stepwise increasing its frequency. However due to the smoothing characteristic of the second PLL circuit 301 a highly linear chirp 302 is generated. The bandwidths of the PLLs 101, 201 are tuned towards optimal phase noise.

A frequency tuner 400 is additionally provided for generating a stepped frequency tuning signal 300 from a tuning signal (reference signal) 303 (e.g. in the range of 10-100 MHz) and for providing said stepped frequency tuning signal, e.g. a sawtooth wave, to the TPM PLL circuit 101 as frequency tuning signal.

The subsampling PLL circuit 201 comprises a second phase detector circuit 210 (SSPD; subsampling phase detector) configured to receive the stepped chirp signal 301 and the smoothened chirp signal 302 and to generate a third phase detection signal 304. A second frequency divider 211 (/N; division by factor N) applies a frequency division on the smoothened chirp signal 302. A second phase-frequency detector and charge pump circuit 212 (DZ-PFD/CP; dead-zone phase frequency detector/charge pump) receives the stepped chirp signal 301 and the smoothened chirp signal 305 after application of the frequency-division and generates a fourth phase detection signal 306.

Further, the subsampling PLL circuit 201 comprises a combiner 213 configured to combine the third phase detection signal 304 and the fourth phase detection signal 306 to obtain a second combined phase detection signal 307. A second loop filter 214 (LF) receives the second combined phase detection signal 307 and generates a second oscillator tuning signal 308. Finally, a second oscillator 215 (VCO; voltage controlled oscillator) receives the second oscillator tuning signal 308 and generates the smoothened chirp signal 302.

Figure 3:
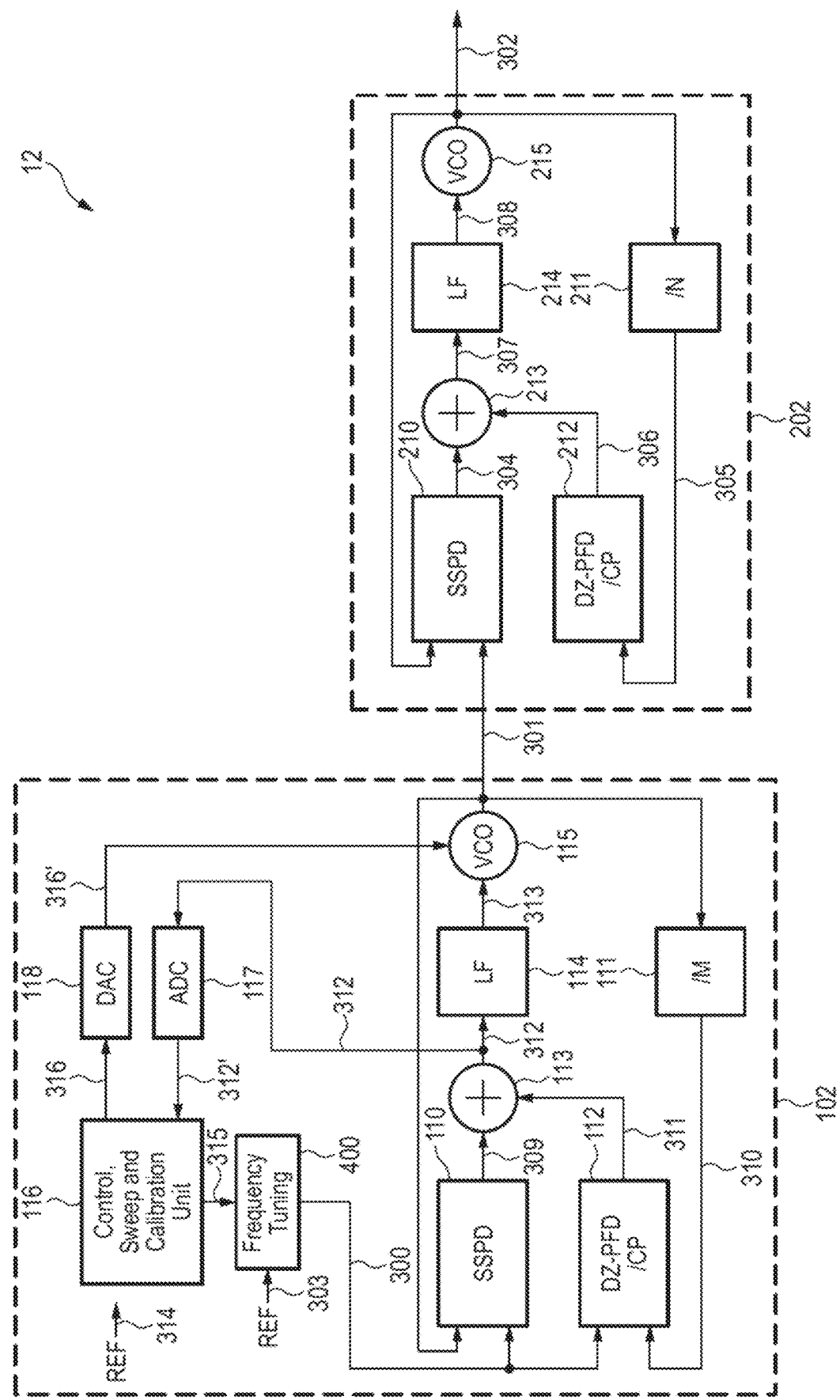
FIG. 3 shows a schematic diagram of a third embodiment of a synthesizer according to the present disclosure.

FIG. 3 shows a schematic diagram of a third embodiment of a synthesizer 12 according to the present disclosure. The subsampling PLL circuit 202 is substantially identical to the subsampling PLL circuit 201 shown in FIG. 2. Further, an exemplary analog TPM PLL circuit 102 is employed to synthesize the stepped frequency signal 301.

The TPM PLL circuit 102 comprises a first phase detector circuit 110 (SSPD) configured to receive the frequency tuning signal 300 and the stepped chirp signal 301 and to generate a first phase detection signal 309. A first frequency divider 111 (/M) applies a frequency division on the stepped chirp signal 301. A first phase-frequency detector and charge pump circuit 112 (DZ-PFD/CP) receives the frequency tuning signal 300 and the stepped chirp signal 310 after application of the frequency-division and generates a second phase detection signal 311.

The TPM PLL circuit 102 further comprises a combiner 113 configured to combine the first phase detection signal 309 and the second phase detection signal 311 to obtain a first combined phase detection signal 312. A first loop filter 114 (LF) receives the first combined phase detection signal 312 and generates a first oscillator tuning signal 313. A first oscillator 115 (VCO) receives the first oscillator tuning signal 313 and generates the stepped chirp signal 301.

The TPM PLL circuit 102 further comprises a control circuit 116 configured to receive a reference signal 314, preferably the same signal as reference signal 303 and to receive a digital combined phase detection signal 312', in this embodiment generated by an analog-digital-converter 117 (ADC) from the combined phase detection signal 312'. Further, the control circuit 116 controls the frequency tuning signal 300, in particular the frequency tuning circuit 400 in the tuning of the frequency tuning signal 300, by use of a first control signal 315 and controls the first oscillator 115 by use of a second control signal 316, in this embodiment by use of an analog second control signal 316' generated by a digital-analog-converter 118 (DAC) from the second control signal 316. In an implementation a digital processor unit may be used as control circuit 116 to control the frequency tuning circuit 400 (also called DDS) and the DAC 118. The VCO tuning voltage and the reference frequency may be adjusted simultaneously. Hence, the PLL remains always locked.

To ensure optimum phase noise, a small bandwidth is preferably used in the TPM PLL circuit 102, whereby generally the bandwidth depends on the intersecting point of the power spectral density (PSD) of the upscaled reference phase noise and the VCO phase noise. The SSPD tuning is not capable of adapting to a high bandwidth chirp with a small loop bandwidth. The TPM PLL circuit is therefore supported by the assistance of two-point modulation.

In the synthesizer according to the present disclosure frequency tuning is simultaneously applied at two points inside the TPM PLL: a) a stepped frequency signal 300 is applied as a reference for the phase frequency detector 112 and/or the phase detector 110; and b) a stepped tuning voltage 316 is applied at the two point modulation point of the voltage controlled oscillator 115. In ideal case the additional tuning voltage 316 at the VCO 115 causes a frequency step which corresponds to the frequency step applied at the reference. The PLL feedback loop is mainly required to compensate nonlinearities, delays or temperature drifts similar to static PLLs which are producing continuous wave signals, e.g. phase noise at low offset frequencies.

In the TPM PLL circuits and the subsampling PLL circuits the respective phase detectors (SSPDs) and the respective phase-frequency detectors (DZ-PFDs) can generally be connected without any additional hardware, which results in a very simple and noiseless design.

Figure 4:
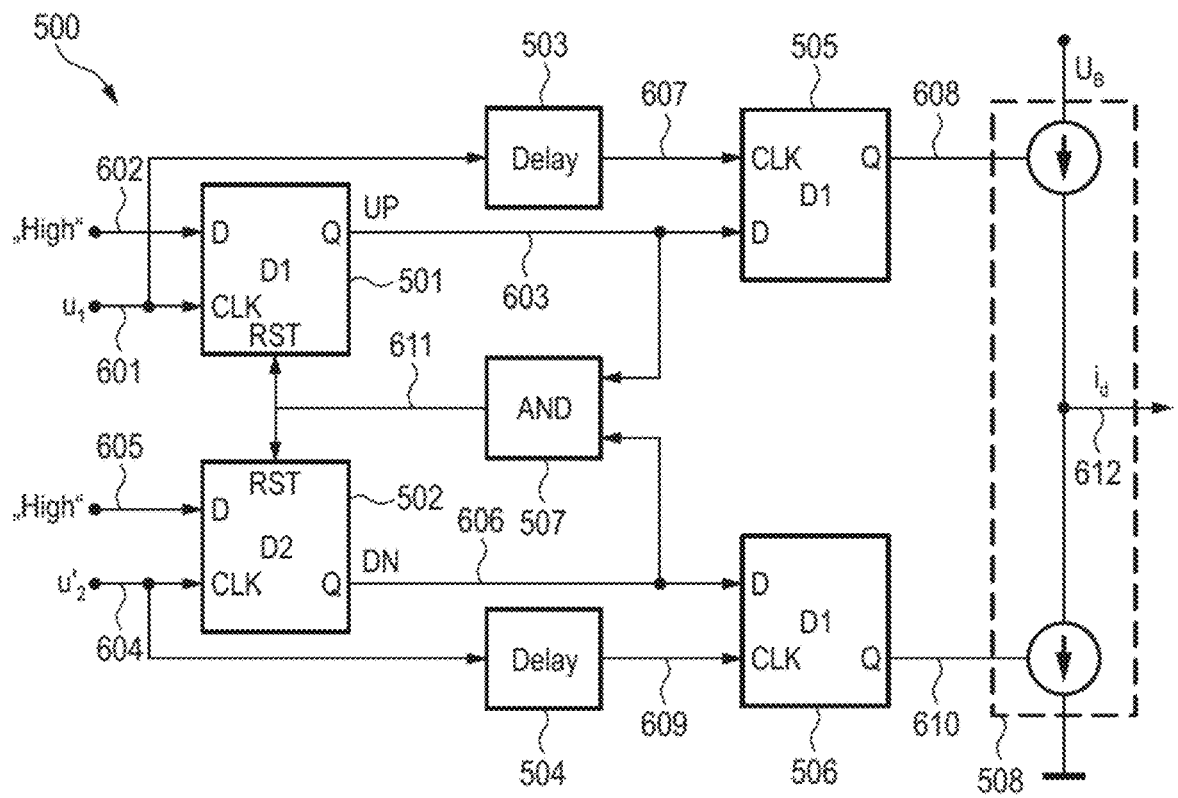
FIG. 4 shows a schematic diagram of an embodiment of a dead zone phase frequency detector according to the present disclosure.

FIG. 4 shows a schematic diagram of an embodiment of a dead zone phase frequency detector 500 according to the present disclosure, which may be used as elements 112 and/or 212 in the synthesizer according to the present disclosure. The dead zone phase frequency detector 500 comprises a first input circuit 501 configured to receive a first input signal 601 and a first reference signal 602 and to generate a first output signal 603 and a second input circuit 502 configured to receive a second input signal 604 and a second reference signal 605 and to generate a second output signal 606. Preferably, the input ports D of both input circuits 501, 502 are forced to a logic high state (in practice they are e.g. connected to a supply voltage), i.e. the reference signals 602 and 605 are identical (e.g. a common reference signal is used as input for both input circuits 501, 502). Both input circuits 501, 502 may be implemented as D-flipflops. The dead zone phase frequency detector 500 further comprises a first delay circuit 503 configured to delay the first input signal 601 by a first delay time and a second delay circuit 504 configured to delay the second input signal 604 by a second delay time. A first latch circuit 505 receives the first delayed input signal 607 and the first output signal 603 and generates a first latch signal 608. A second latch circuit 506 receives the second delayed input signal 609 and the second output signal 606 and generates a second latch signal 610. Further, a logic circuit 507, in this embodiment a logic AND circuit, is provided that receives the first output signal 603 and the second output signal 606 and generates a logic signal 611 that is provided to as reset signal to the first input circuit 501 and the second input circuit 502. Finally, an output circuit 508, e.g. a charge pump with two MOS transistors as current sources, is provided that receives the first latch signal 608 and the second latch signal 610 and generates the phase detection signal 612, e.g. the phase detection signal 311 or 306 in the synthesizer 12 shown in FIG. 3.

The PFD may consist of two D-flipflops, each driven by either the reference signal u1 (601) or the downscaled VCO signal u2' (604) coming from the frequency divider. A rising edge of either the signals causes the particular D-flip flop (501 and 502) to pass through the high-state signal (602 or 605 respectively) at its in port "D" towards the out port "Q" (603 or 606 respectively). As soon as both the "Q" output ports (603 and 606) are in high state, the logic AND gate (507) will output another "high" state signal (not assigned with number) towards the "RST" inputs, disabling both D-flip flops (501 and 502). The output ports "Q" (603 and 606) are again on "low-state", hence causing the AND gate (507) to again enable both D-flip flops (501 and 502) waiting for the next rising edge of the input signals (601 and 604 respectively). This way, a PFD can experience three states, giving it the name "tri-state PFD". With both flip flops being active and waiting for a rising edge, the "0-state" is held. Neither of the signals "UP" or "DN" are on the logic "high-state". When a rising edge of the reference signal causes the upper D-flip flop to change its output to the "high-state", the PFD is in state "+1". If however a rising edge in the downscaled VCO signal reaches the lower D-flip flop first, the PFD changes to "−1" state instead. With either a rising edge in the downscaled signal while in state "+1", or in the reference signal, while in state "−1", the PFD is reset, changing back to state "0". As the time during which the PFD is in state "+1" or "−1" is equal to the time difference of the rising edges, it is also proportional to the phase error. In the ideal case, a PFD with current output would be able to detect arbitrarily small phase errors. By adding delay lines (503 and 504 respectively) and D-latches (505 and 506 respectively) to the circuit, a dead-zone is created, in which the PFD output is not passing its output signals (603 and 606) to the charge-pump (508). The delay lines each output a signal (607 and 609 respectively), which signal is by a specified time constant a delayed version of the respective input signal (601 and 604 respectively). The D-latches pass through their input signals (603 and 606 respectively) as soon as the delayed signals are on "high" state. The output signals of the D-latches (608 and 610) are causing the MOS transistors of the charge-pump to generate each a current signal summing up to i_d (612).

The dead zone phase frequency detector 500 illustrated in FIG. 4 is preferably applied in a synthesizer (as DZ-PFD circuit) according to the present disclosure. Alternatively, conventional DZ-PFDs may be used, as e.g. described in K. Raczkowski et al., "A 9.2-12.7 GHz Wideband Fractional-N Subsampling PLL in 28 nm CMOS With 280 fs RMS Jitter," IEEE Journal of Solid-State Circuits, Vol. 50, No. 5, May 2015 or in X. Gao et al., "A Low Noise Sub-Sampling PLL in Which Divider Noise is Eliminated and PD/CP Noise is Not Multiplied by $N^2$", IEEE Journal of Solid-State Circuits, December 2009. As long as the PLL is locked and the SSPD is in its linear phase detection region, the PFD is in Dead Zone and will not output any correction impulses. Phase noise, therefore, is added by neither the frequency divider, nor the PFD during that time. Further, PD/CP noise is not multiplied by the square of the division ratio N. When applying this concept to FMCW chirp generation in the mm-wave region, a large ratio N is needed. When choosing the bandwidth, a large N causes this concept to reach its limits in both, maximal chirp speed and optimal phase noise performance. When using inverters after the PFD, a Dead Zone of $\pi/2$ is created. However, a Dead Zone as large as the SSPD linear phase detection range $\pi/(2N)$ can be created by implementing delay lines instead of inverters, as provided in the DZ-PFD according to the present disclosure. In this way, the PFD is tuning towards the desired frequency, as soon as phase errors exceed the SSPD's linear range. Instead of using a pulser following the SSPD, the sampled VCO signal should be held until the next sampling. Thereby, a reference feedthrough modulating the output signal may at least partly be avoided. In case of a constant phase error, the SSPD gives a constant output (no feedthrough). When the detected phase error changes, also the SSPD output will be updated with the reference beat. The PFD would however always output impulses. A constant phase error appears when implementing a LF with one pole at s=0 and applying a frequency ramp as done in the disclosed system.

Figure 5:
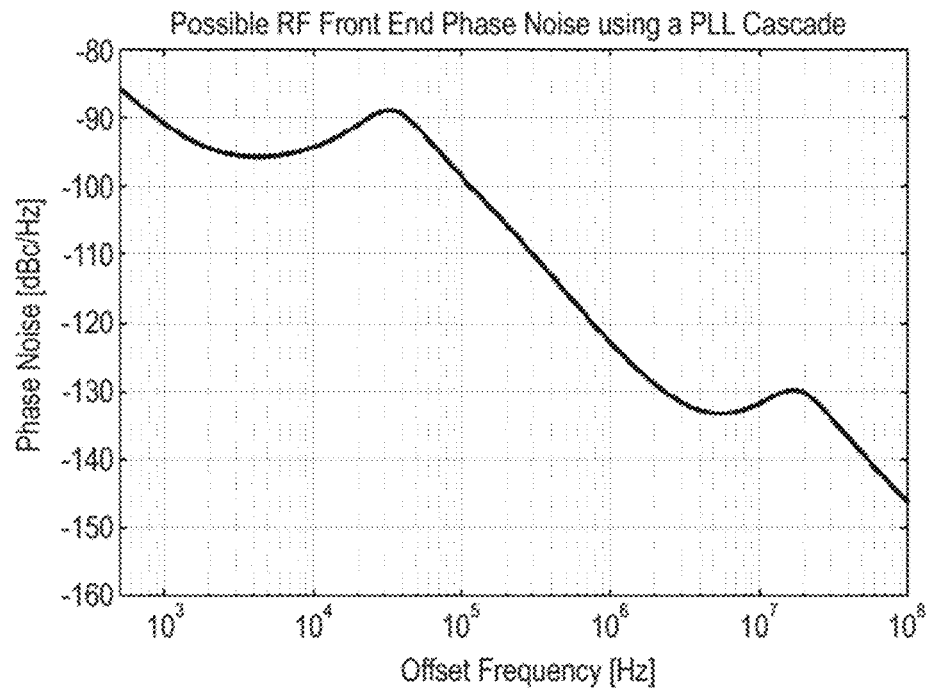
FIG. 5 shows a diagram of a theoretical phase noise curve of the synthesizer according to the present disclosure.

FIG. 5 shows a diagram of a theoretical phase noise curve of the synthesizer according to the present disclosure. The phase noise curve can be estimated by evaluation of the theoretical transfer functions. It can be seen from FIG. 5 that an exceptional phase noise curve for small and large offset frequencies is achieved, when upscaling PLL output to the 80 GHz region. The smallest offset frequency which needs to be considered in the FMCW radar is defined by the window function in the slow time domain. This window is in the order of 1 kHz. The largest offset frequency is related to the first Nyquist zone of the baseband analog to digital converters which is in the order of 10 MHz. The achieved PLL synthesizer topology reduces the phase noise at the complete bandwidth including both frequencies.

Figure 6A:
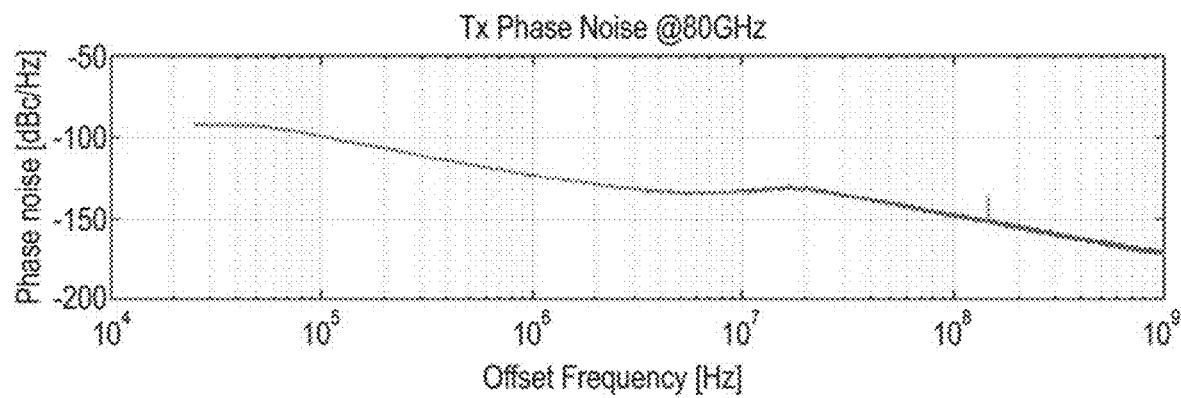
FIG. 6a-FIG. 6b show a diagram of a simulated phase noise and angle deviation of the synthesizer according to the present disclosure.
Figure 6B:
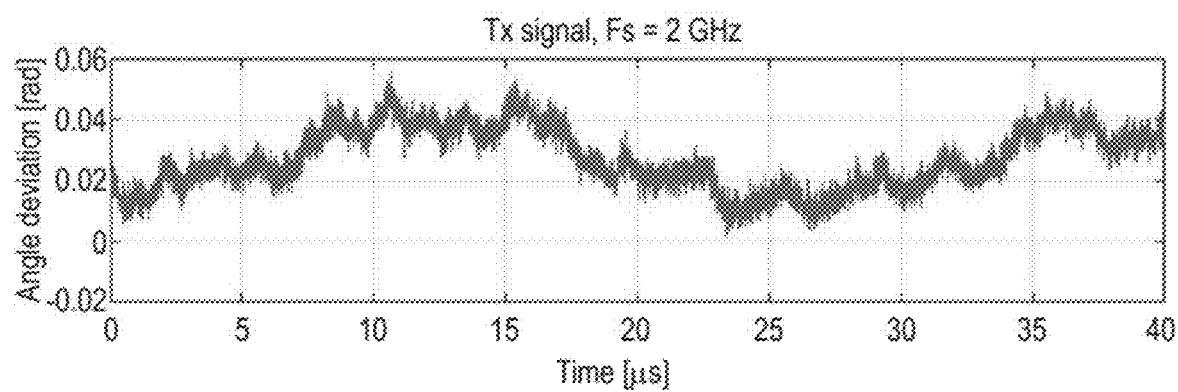

FIG. 6 shows a diagram of a simulated phase noise and angle deviation of the synthesizer according to the present disclosure. FIG. 6A shows the simulated phase noise curve of the synthesizer topology including two-point modulation which is in excellent agreement with the theoretical expectations, and FIG. 6B shows the simulated angle deviation.

Figure 7:
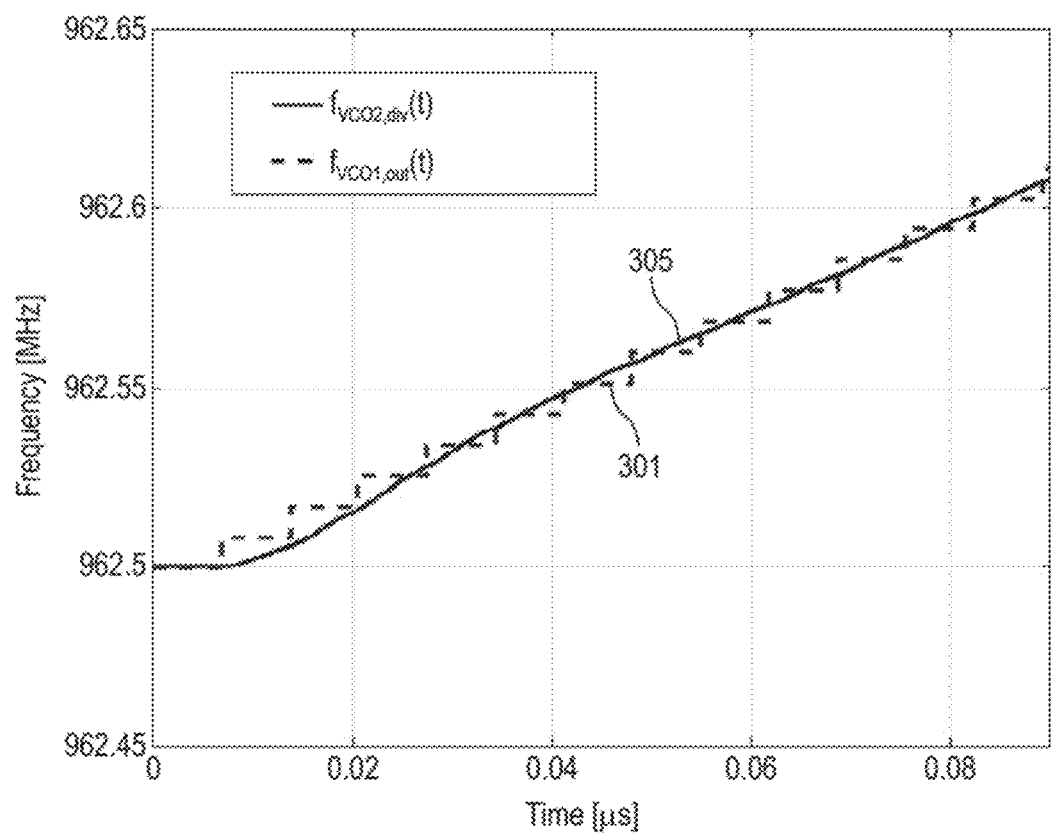
FIG. 7 shows a diagram of frequency error at the beginning of a chirp.

FIG. 7 shows a diagram of frequency error at the beginning of a chirp. FIG. 7 particularly shows the settling time at the beginning of the chirp. Approximately 100 ns are required until the cascaded subsampling PLL circuit follows the frequency steps without significant frequency errors. Settling times of known synthesizers are in the order of μs.

Figure 8:
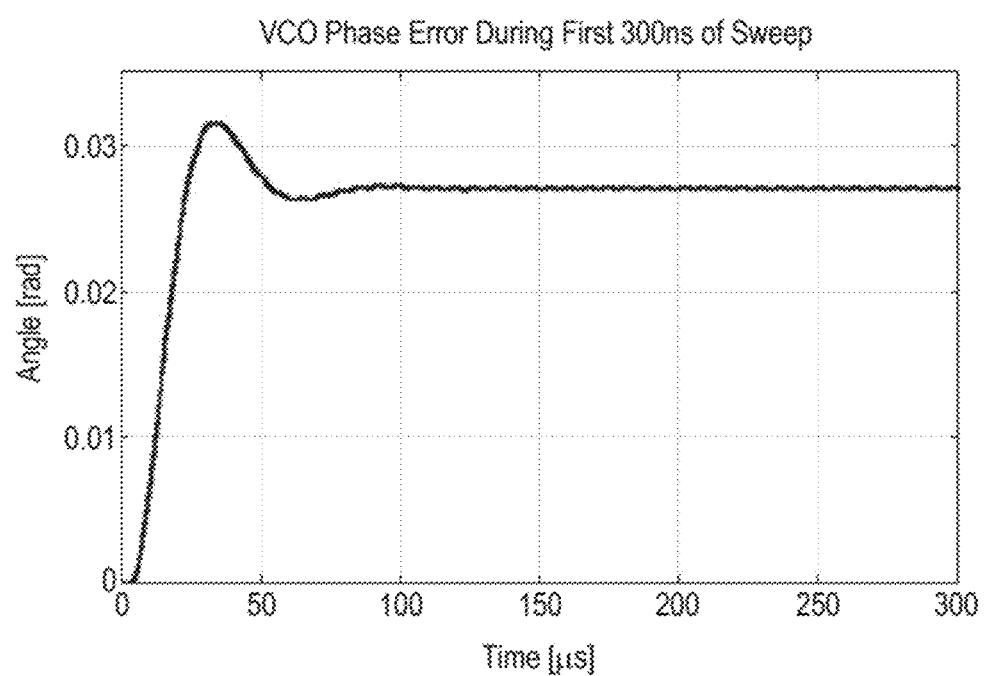
FIG. 8 shows a diagram of phase error at the beginning of a chirp.

FIG. 8 shows a diagram of phase error at the beginning of a chirp. To further illustrate the settling behavior of the synthesizer the phase error at the output of the cascaded subsampling PLL circuit is particularly computed. It can be seen that a constant phase error is achieved after 100 ns.

Figure 9:
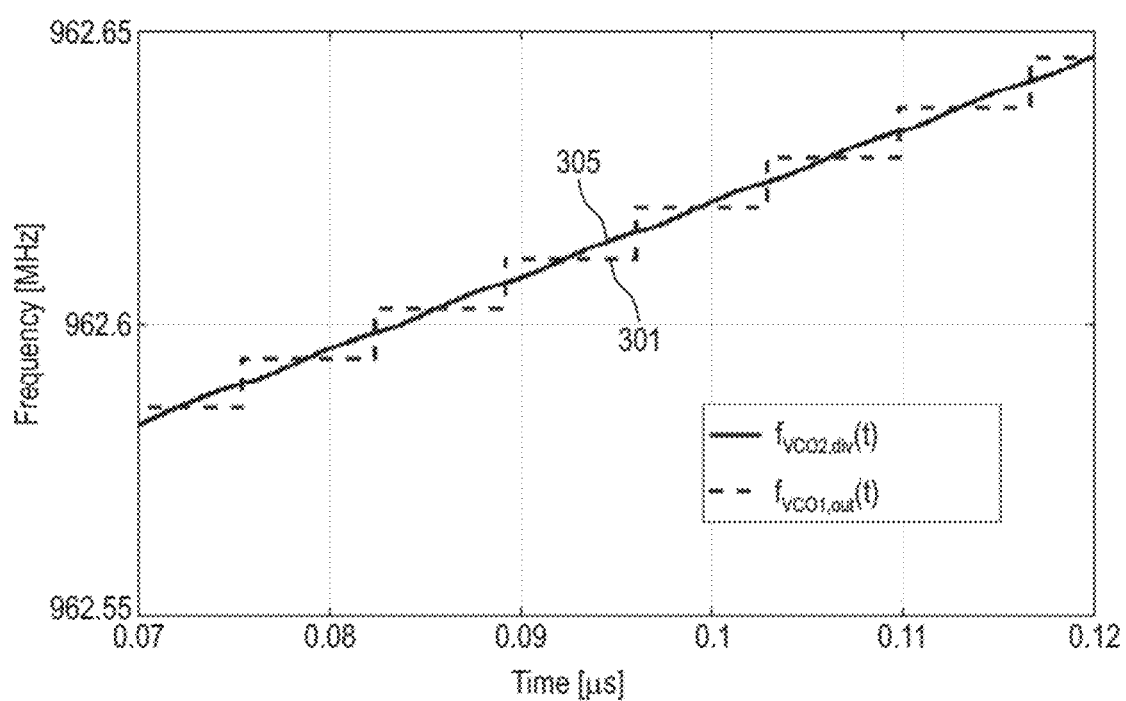
FIG. 9 shows a diagram illustrating frequency smoothing caused by the subsampling PLL in the synthesizer according to the present disclosure.

FIG. 9 shows a diagram illustrating frequency smoothing caused by the subsampling PLL in the synthesizer according to the present disclosure. A staircase or stepped frequency ramp leads to ghost targets in the radar image. The cascaded PLL leads to a smoothening of the introduced staircases, which leads to an almost linear chirp 305. Smoothening of the curve is achieved due to the low pass behavior of the loop filter in the cascaded subsampling PLL circuit.

Figure 10:
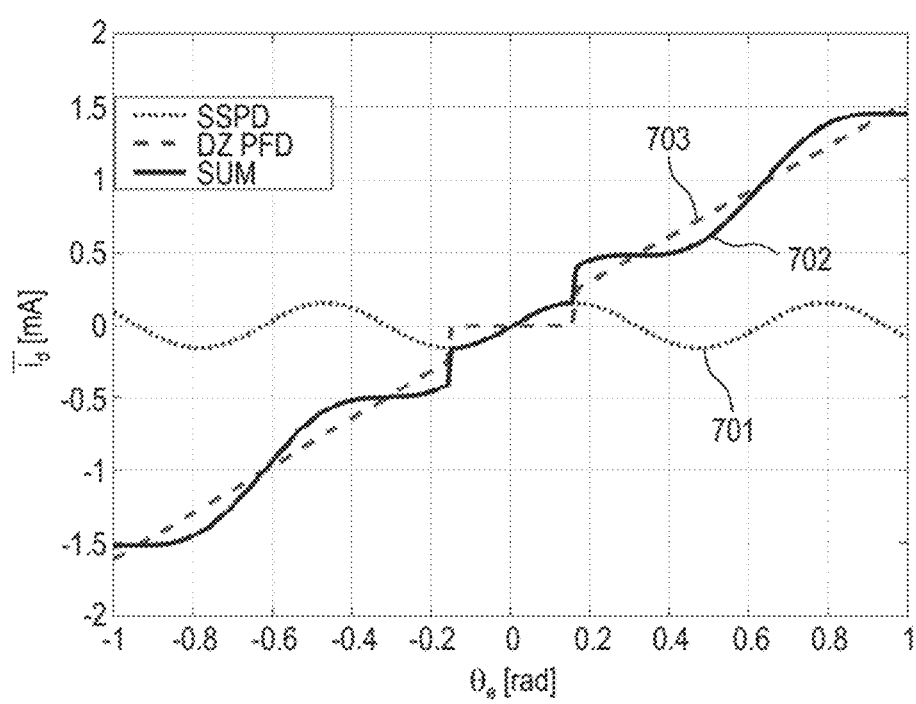
FIG. 10 shows a diagram illustrating the resulting output current at a combined subsampling phase detector and phase frequency detector output related to the phase error.

FIG. 10 shows a diagram illustrating the resulting averaged output current 701 at a combined sub-sampling phase detector (SSPD) and the phase frequency detector (PFD) output 702 related to the phase error. Further, the sum signal 703 is shown. It can be seen that only the SSPD contributes to the output current at small phase errors.

A DZ-PFD has a much larger range in which it can detect phase errors and proportionally output an average current output. Within the dead zone, the DZ-PFD does not generate any current output. An SSPD is only able to generate an averaged current output, which is approximately proportional to the detected phase error within a very limited range. As soon as phase errors exceed this range, the SSPD cannot work properly anymore. The dead zone is implemented such that the DZ-PFD assists the SSPD as soon as this limit is reached.

Figure 11:
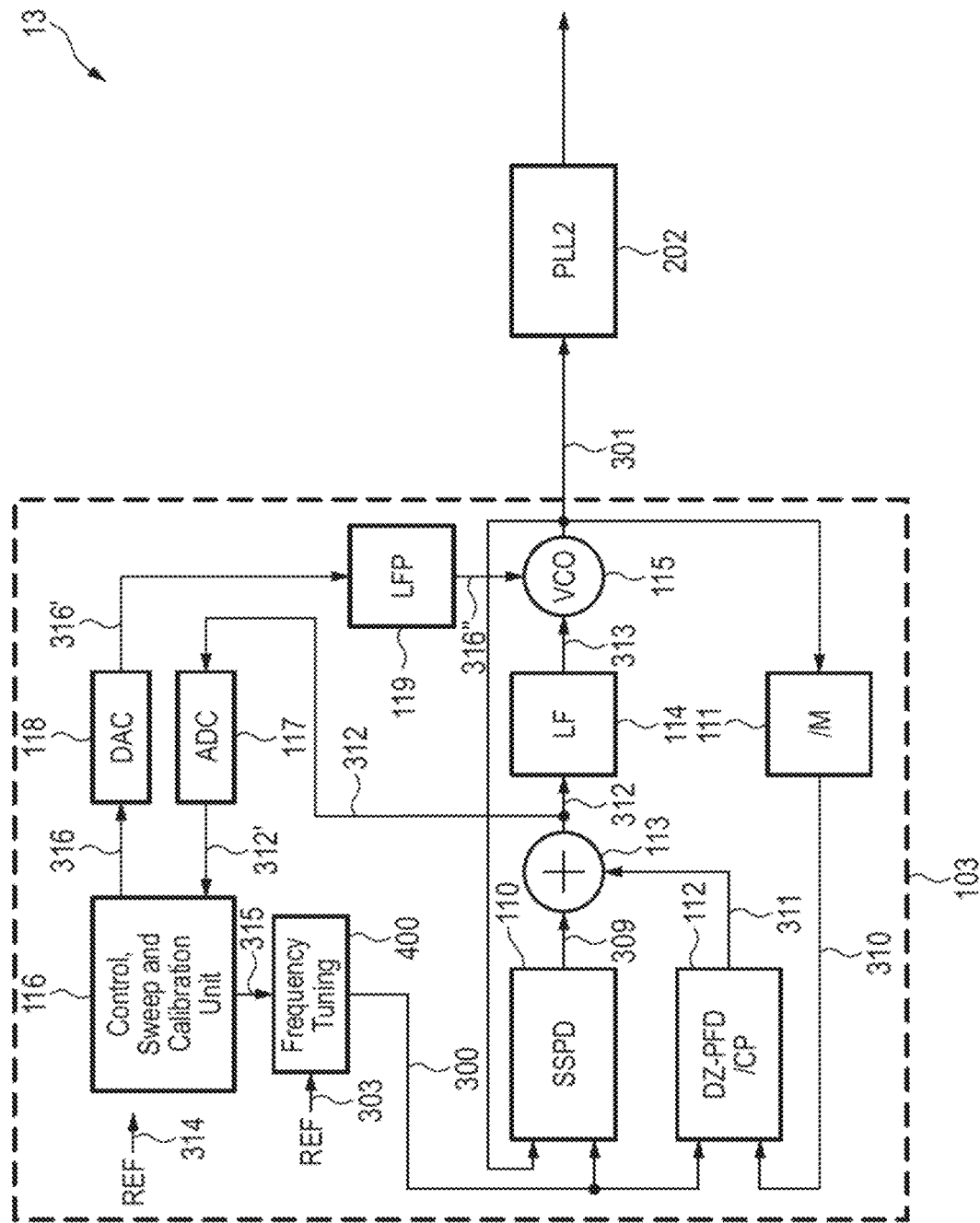
FIG. 11 shows a schematic diagram of a fourth embodiment of a synthesizer according to the present disclosure.

FIG. 11 shows a schematic diagram of a fourth embodiment of a synthesizer 13 according to the present disclosure comprising a modified TPM PLL circuit 103. In the synthesizers 11 and 12 shown in FIG. 3 smoothening of the ramp staircases is achieved due to the subsampling PLL circuit 202. However, small ripples are still visible as illustrated in FIGS. 6 and 9. Further ripple reduction can be achieved with the embodiment presented in FIG. 11. In this embodiment smoothening of staircases in the VCO tuning voltage 316' is achieved by a lowpass filter 119 to obtain a filtered VCO tuning voltage 316". Additional digital filtering or interpolation may be applied in the frequency tuning circuit 400.

Figure 12:
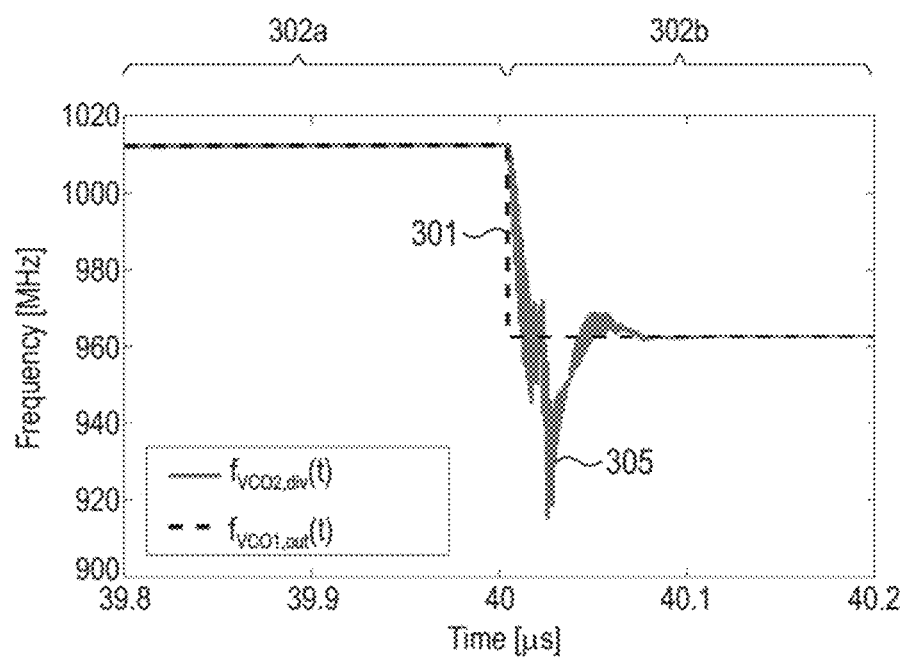
FIG. 12 shows a diagram of simulated phase lock recovery between two sawtooth chirps.

FIG. 12 shows a diagram of simulated phase lock recovery between two sawtooth chirps 302a and 302b (actually, only the end of the first chirp 302 and the beginning of the second chirp 302b are depicted). The signal processing can be simplified by utilizing sawtooth chirps. Hence, a large frequency step between two consecutive chirps is required. A particular timeframe is necessary to achieve phase lock after setting the system to the chirp start frequency. As long as the phase is not locked the waveforms are not usable for signal processing. This effect is shown in FIG. 12 showing the signals 301 and 305. The target is to minimize the timeframes where the PLL is out of lock as much as possible.

Figure 13:
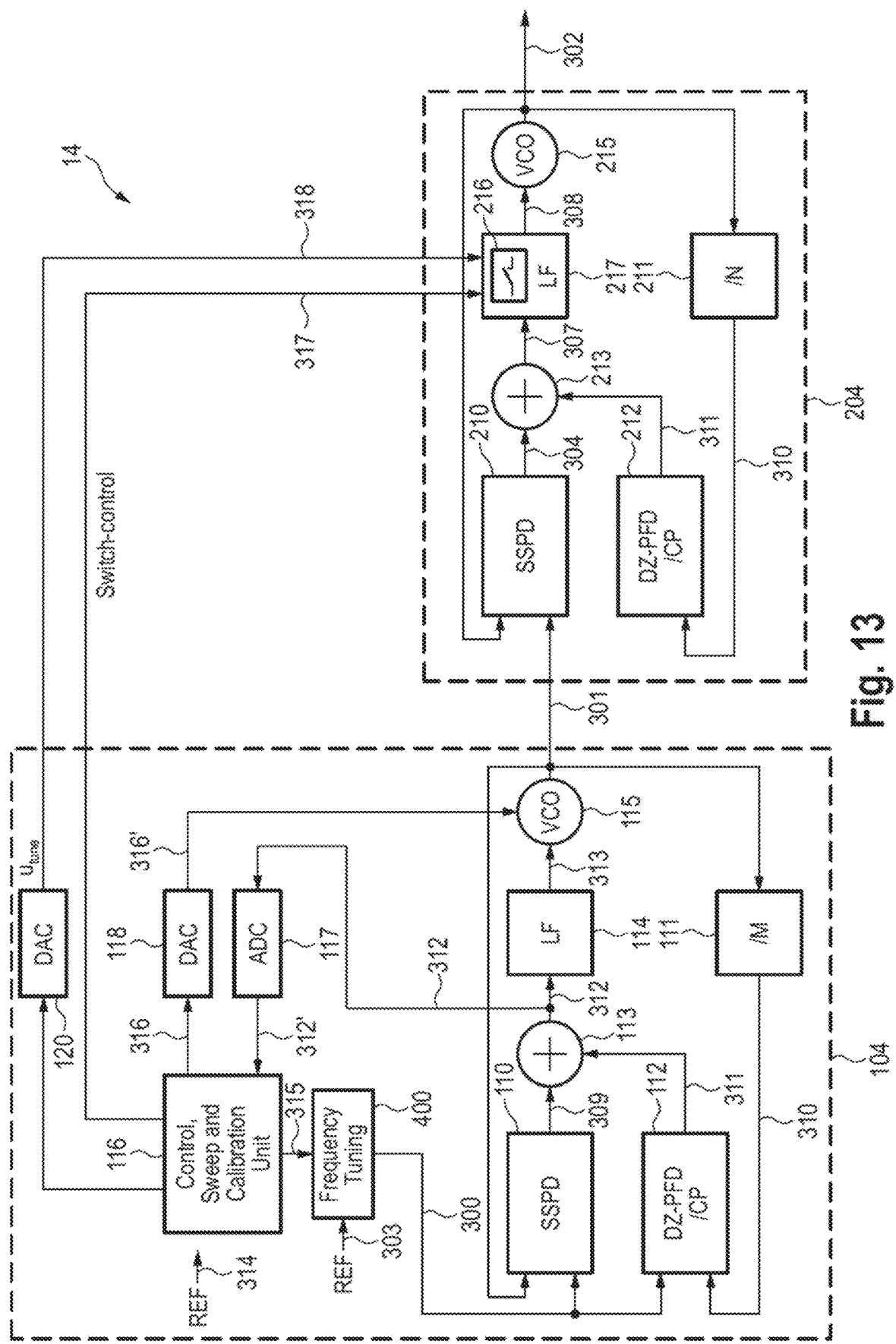
FIG. 13 shows a schematic diagram of a fifth embodiment of a synthesizer according to the present disclosure.

This target is achieved by tuning the loop filter 214 of the subsampling PLL circuit 202. FIG. 13 shows a schematic diagram of a corresponding fifth embodiment of a synthesizer 14 according to the present disclosure comprising a modified TPM PLL circuit 104 and a modified subsampling PLL circuit 204. A switch 216 inside the loop filter 217 can be toggled by a control signal 317 which is provided by the control unit 116. The tuning voltage 308 at the VCO 215 is immediately changed by a tuning voltage 318 (u tune) from a DAC 120 after tune, the switch 216 is closed. Hence, the VCO output frequencies are simultaneously adjusted to the chirp start frequency. The switch 216 is opened again and phase lock is achieved in a very short time period.

Figure 14:
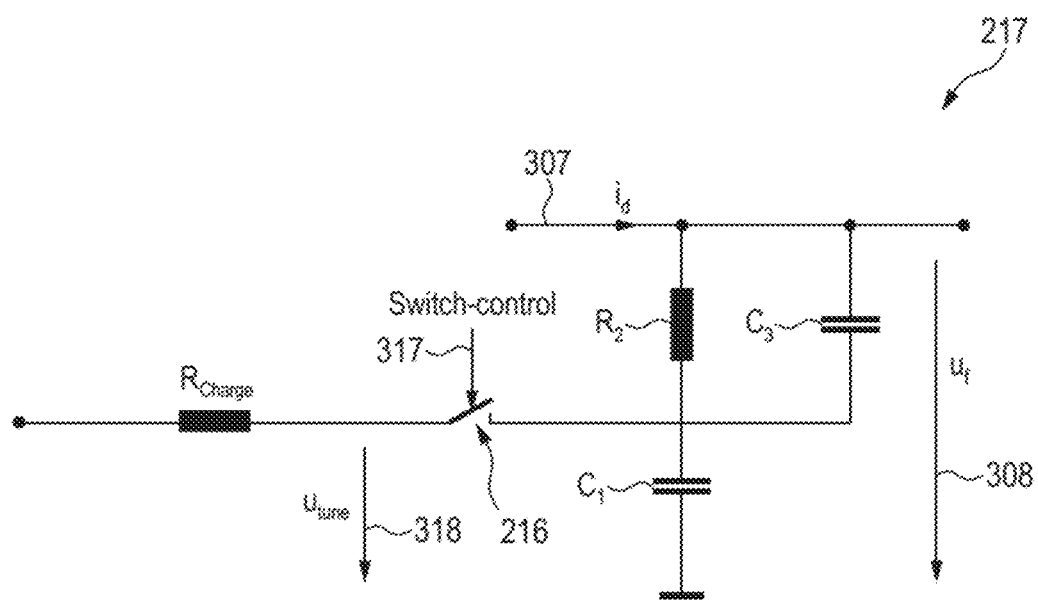
FIG. 14 shows a schematic diagram of a tunable loop filter as used in a synthesizer according to the present disclosure.

FIG. 14 shows a schematic diagram of a tunable (passive) loop filter 217 as used in the synthesizer 14 shown in FIG. 13. The VCO tuning voltage 308 can be changed very quickly by applying the DAC tuning voltage 318 directly at capacitor C1.

The above disclosed embodiments of the synthesizer make use of preferred embodiment of a TPM PLL circuit and of a subsampling PLL circuit. In alternative embodiments of the synthesizer according to the present disclosure conventional embodiments of a TPM PLL circuit (e.g. as disclosed in H. Yeo et al., "A 940 MHz-Bandwidth 28.8 us-Period 8.9 GHz Chirp Frequency Synthesizer PLL in 65 nm CMOS for X-Band FMCW Radar Applications," IEEE International Solid-State Circuits Conference (ISSCC), February 2016) and/or of a subsampling PLL circuit (e.g. as disclosed in K. Raczkowski et al., "A 9.2-12.7 GHz Wideband Fractional-N Subsampling PLL in 28 nm CMOS With 280 fs RMS Jitter," IEEE Journal of Solid-State Circuits, Vol. 50, No. 5, May 2015) may be used.

With the synthesizer and/or the dead zone phase frequency detector according to the present disclosure various advantages can be achieved. Divider ratios at the feedback loop of the PLLs are reduced due to the cascade. PLL bandwidths are chosen for optimal phase noise performance so that phase noise is decreased. Frequency steps of the two-point modulation are smoothed by the PLL cascade so that spurious tones are decreased. The fractional logic of known analog two-point modulated PLLs is replaced by tuning the reference. Faster chirps can thus be achieved as the oversampling of the fractional logic is not required.

Finally, additional tuning of the filters can be employed for implementing fast locking techniques.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A synthesizer comprising
   a two-point modulation phase locked loop, TPM PLL, circuit configured to receive a frequency tuning signal and to generate a stepped chirp signal in an intermediate frequency range by applying a two-point modulation PLL on the frequency tuning signal, and
   a subsampling PLL circuit configured to receive the stepped chirp signal in a mm-wave frequency range and to generate a smoothened chirp signal in a mm-wave frequency range by applying a subsampling PLL on the stepped chirp signal.
2. The synthesizer as defined in embodiment 1,
   wherein the TPM PLL circuit comprises
   a first phase detector circuit configured to receive the frequency tuning signal and the stepped chirp signal and to generate a first phase detection signal,
   a first frequency divider configured to apply a frequency division on the stepped chirp signal, and
   a first phase-frequency detector and charge pump circuit configured to receive the frequency tuning signal and the stepped chirp signal after application of the frequency-division and to generate a second phase detection signal.
3. The synthesizer as defined in embodiment 2,
   wherein the TPM PLL circuit further comprises
   a first loop filter configured to receive the first phase detection signal and the second phase detection signal or to receive a first combined phase detection signal resulting from a combination of the first phase detection signal and the second phase detection signal and generate a first oscillator tuning signal and
   a first oscillator configured to receive the first oscillator tuning signal and to generate the stepped chirp signal.
4. The synthesizer as defined in embodiment 3,
   wherein the TPM PLL circuit further comprises a control circuit configured to receive a reference signal, to receive the first phase detection signal and the second phase detection signal or to receive a combined phase detection signal resulting from a combination of the first phase detection signal and the second phase detection signal, to control the frequency tuning signal and to control the first oscillator.
5. The synthesizer as defined in any one of embodiments 1 to 4,
   wherein the subsampling PLL circuit comprises
   a second phase detector circuit configured to receive the stepped chirp signal and the smoothened chirp signal and to generate a third phase detection signal,
   a second frequency divider configured to apply a frequency division on the smoothened chirp signal, and
   a second phase-frequency detector and charge pump circuit configured to receive the stepped chirp signal and the smoothened chirp signal after application of the frequency-division and to generate a fourth phase detection signal.
6. The synthesizer as defined in embodiment 5,
   wherein the subsampling PLL circuit further comprises
   a second loop filter configured to receive the third phase detection signal and the fourth phase detection signal or to receive a second combined phase detection signal resulting from a combination of the third phase detection signal and the fourth phase detection signal and generate a second oscillator tuning signal and
   a second oscillator configured to receive the second oscillator tuning signal and to generate the smoothened chirp signal.
7. The synthesizer as defined in any one of embodiments 2 to 6,
   wherein the first phase detector of the TPM PLL circuit and/or the second phase detector of the subsampling PLL circuit comprises a subsampling phase detector.
8. The synthesizer as defined in any one of embodiments 2 to 7,
   wherein the first phase-frequency detector and charge pump circuit of the TPM PLL circuit and/or the second phase-frequency detector and charge pump circuit of the subsampling PLL circuit comprises a dead zone phase frequency detector.
9. The synthesizer as defined in embodiment 8,
   wherein the dead zone phase frequency detector is configured to generate a predetermined time interval in which the dead zone phase frequency detector does not generate a phase detection signal.
10. The synthesizer as defined in embodiment 8 or 9,
    wherein the dead zone phase frequency detector comprises delay circuits configured to set the predetermined time interval.

11. The synthesizer as defined in embodiment 4, 5 or 6, wherein the TPM PLL circuit further comprises a low pass filter arranged between the control circuit and the first oscillator and configured to filter a control signal generated by the control circuit to control the first oscillator.

12. The synthesizer as defined in embodiment 6, wherein the second loop filter comprises a controlled switch configured to set the second oscillator tuning signal to a predetermined control value at the end of a chirp.

13. The synthesizer as defined in any preceding embodiment, further comprising a frequency tuner for generating a stepped frequency tuning signal from a tuning signal and for providing said stepped frequency tuning signal to the TPM PLL circuit as frequency tuning signal.

14. A dead zone phase frequency detector configured comprising circuitry configured to generate a phase detection signal, wherein the circuitry is configured to generate a predetermined time interval in which the dead zone phase frequency detector does not generate a phase detection signal.

15. The dead zone phase frequency detector as defined in embodiment 14, comprising delay circuits configured to set the predetermined time interval.

16. The dead zone phase frequency detector as defined in embodiment 15, further comprising:
a first input circuit configured to receive a first input signal and a first reference signal and to generate a first output signal,
a second input circuit configured to receive a second input signal and a second reference signal and to generate a second output signal,
a first delay circuit configured to delay the first input signal by a first delay time,
a second delay circuit configured to delay the second input signal by a second delay time,
a first latch circuit configured to receive the first delayed input signal and the first output signal and to generate a first latch signal,
a second latch circuit configured to receive the second delayed input signal and the second output signal and to generate a second latch signal,
a logic circuit configured to receive the first output signal and the second output signal and to generate a logic signal that is provided to as reset signal to the first input circuit and the second input circuit, and
an output circuit configured to receive the first latch signal and the second latch signal and to generate the phase detection signal.

17. The dead zone phase frequency detector as defined in embodiment 16, wherein the first input circuit and the second input circuit are D-flipflops and wherein the first latch circuit and the second latch circuit are D-latches.

The invention claimed is:

1. A synthesizer comprising
a two-point modulation phase locked loop, TPM PLL, circuit configured to receive a frequency tuning signal and to generate a stepped chirp signal in an intermediate frequency range by applying a two-point modulation PLL on the frequency tuning signal, and
a subsampling PLL circuit configured to receive the stepped chirp signal in a mm-wave frequency range and to generate a smoothened chirp signal in a mm-wave frequency range by applying a subsampling PLL on the stepped chirp signal.

2. The synthesizer as claimed in claim 1,
wherein the TPM PLL circuit comprises
a first phase detector circuit configured to receive the frequency tuning signal and the stepped chirp signal and to generate a first phase detection signal,
a first frequency divider configured to apply a frequency division on the stepped chirp signal, and
a first phase-frequency detector and charge pump circuit configured to receive the frequency tuning signal and the stepped chirp signal after application of the frequency-division and to generate a second phase detection signal.

3. The synthesizer as claimed in claim 2,
wherein the TPM PLL circuit further comprises
a first loop fitter configured to receive the first phase detection signal and the second phase detection signal or to receive a first combined phase detection signal resulting from a combination of the first phase detection signal and the second phase detection signal and generate a first oscillator tuning signal and
a first oscillator configured to receive the first oscillating signal and to generate the stepped chirp signal.

4. The synthesizer as claimed in claim 3,
wherein the TPM PLL circuit further comprises a control circuit configured to receive a reference signal, to receive the first phase detection signal and the second phase detection signal or to receive a combined phase detection signal resulting from a combination of the first phase detection signal and the second phase detection signal, to control the frequency tuning signal and to control the first oscillator.

5. The synthesizer as claimed in claim 4,
wherein the TPM PLL circuit further comprises a low pass filter arranged between the control circuit and the first oscillator and configured to filter a control signal generated by the control circuit to control the first oscillator.

6. The synthesizer as claimed in claim 2,
wherein the first phase detector of the TPM PLL circuit and/or the second phase detector of the subsampling PLL circuit comprises a subsampling phase detector.

7. The synthesizer as claimed in claim 2,
wherein the first phase-frequency detector and charge pump circuit of the TPM PLL circuit and/or the second phase-frequency detector and charge pump circuit of the subsampling PLL circuit comprises a dead zone phase frequency detector.

8. The synthesizer as claimed in claim 7,
wherein the dead zone phase frequency detector is configured to generate a predetermined time interval in which the dead zone phase frequency detector does not generate a phase detection signal.

9. The synthesizer as claimed in claim 7,
wherein the dead zone phase frequency detector comprises delay circuits configured to set the predetermined time interval.

10. The synthesizer as claimed in claim 1,
wherein the subsampling PLL circuit comprises
a second phase detector circuit configured to receive the stepped chirp signal and the smoothened chirp signal and to generate a third phase detection signal,
a second frequency divider configured top a frequency division on the smoothened chirp signal, and
a second phase-frequency detector and charge pump circuit configured to receive the stepped chirp signal and the smoothened chirp signal after application of the frequency-division and to generate a fourth phase detection signal.

11. The synthesizer as claimed in claim 10,
wherein the subsampling PLL circuit further comprises
- a second loop filter configured to receive the third phase detection signal and the fourth phase detection signal or to receive a second combined phase detection signal restating from a combination of the third phase detection signal and the fourth phase detection signal and generate a second oscillator tuning signal and
- a second oscillator configured to receive the second oscillator tuning signal and to generate the smoothened chirp signal.

12. The synthesizer as claimed in claim 11,
wherein the second loop fitter comprises a controlled switch configured to set the second oscillator tuning signal to a predetermined control value at the end of a chirp.

13. The synthesizer as claimed in claim 1,
further comprising a frequency tuner for generating a stepped frequency tuning signal from a tuning signal and for providing said stepped frequency tuning signal to the TPM PLL circuit as frequency tuning signal.

\* \* \* \* \*